United States Patent
Oishi et al.

(10) Patent No.: US 8,247,844 B2
(45) Date of Patent: Aug. 21, 2012

(54) SEMICONDUCTOR DEVICE AND MANUFACTURING METHOD THEREOF

(75) Inventors: Toshiyuki Oishi, Tokyo (JP); Yoshitsugu Yamamoto, Tokyo (JP); Hiroshi Otsuka, Tokyo (JP); Koji Yamanaka, Tokyo (JP); Akira Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 94 days.

(21) Appl. No.: 12/574,995

(22) Filed: Oct. 7, 2009

(65) Prior Publication Data

US 2010/0244041 A1  Sep. 30, 2010

(30) Foreign Application Priority Data

Mar. 30, 2009  (JP) .................. 2009-082480

(51) Int. Cl.
   *H01L 31/0328* (2006.01)
   *H01L 31/0336* (2006.01)
   *H01L 31/072* (2012.01)
   *H01L 31/109* (2006.01)

(52) U.S. Cl. .......... 257/194; 257/E29.246; 257/E29.247

(58) Field of Classification Search ................. 258/194; 257/194

See application file for complete search history.

(56) References Cited

U.S. PATENT DOCUMENTS

| | | | |
|---|---|---|---|
| 2001/0020700 A1 | 9/2001 | Inoue et al. | |
| 2006/0255364 A1* | 11/2006 | Saxler et al. | 257/192 |
| 2008/0237639 A1 | 10/2008 | Nanjo et al. | |
| 2009/0045438 A1 | 2/2009 | Inoue et al. | |
| 2010/0117118 A1* | 5/2010 | Dabiran et al. | 257/190 |

FOREIGN PATENT DOCUMENTS

| | | |
|---|---|---|
| JP | 2001-196575 | 7/2001 |
| WO | WO 2007/077666 A1 | 7/2007 |

OTHER PUBLICATIONS

Y. Pei et al., "X- and Ka-band power performance of AlGaN/GaN HEMTs grown by ammonia-MBE", Electronics Letters, vol. 44 No. 9, Apr. 24, 2008, 2 pages.

* cited by examiner

*Primary Examiner* — Thien F Tran
(74) *Attorney, Agent, or Firm* — Oblon, Spivak, McClelland, Maier & Neustadt, L.L.P.

(57) ABSTRACT

An isolation layer for suppressing a leakage current is provided at least between a channel layer and a buffer layer formed under the channel layer in the buffer layer.

3 Claims, 11 Drawing Sheets

SEMICONDUCTOR DEVICE AND MANUFACTURING METHOD THEREOF

BACKGROUND OF THE INVENTION

1. Field of the Invention

The present invention relates to a semiconductor device such as a high electron mobility transistor (HEMT; High Electron Mobility Transistor) employing nitride semiconductor materials as typified by GaN, and a manufacturing method of the semiconductor device.

2. Description of the Related Art

A conventional HEMT employing nitride semiconductor materials as typified by GaN has a structure where a thin AlGaN layer is deposited over a thick GaN layer and electrons are passed within the GaN in the vicinity of the AlGaN layer.

For example, in non-patent document 1, an AlN buffer layer (50 nm in thickness), a GaN layer (750 nm in thickness), and an AlGaN layer (30 nm in thickness) are deposited over a semi-insulating SiC substrate. Of those layers, only the AlGaN layer and the GaN layer in the vicinity of the AlGaN layer are required for operations, and the AlN layer and the GaN layer in large part are provided for making a high-quality crystal on the SiC substrate.

In general, an area where a current required for operations flows is called a "channel" and an area for improving the crystal property is called a "buffer." In non-patent document 1, however, since most of those layers are buffers, those layers are called "buffers" without discrimination between the buffer and the channel.

Non-patent document 1 shows a relation between the drain current and the drain voltage in a GaN-HEMT which is constructed as described above. A large drain current exceeding 1 A/mm and a change in drain current achieved by a change in gate voltage are observed, and excellent electric characteristics are obtained therein.

Since an HEMT is in an off state when the gate voltage is smaller than or equal to the pinch-off voltage, the drain current does not flow under normal conditions. However, in the GaN-HEMT shown in non-patent document 1, when the drain voltage is increased, the drain current gradually increases. The drain current is a redundant leakage current that is not requisite in the transistor operation.

Non-patent document 1: Pei, Y. et al., "X- and Ka-band power performance of AlGaN/GaN HEMTs grown by ammonia-MBE", Electronics Letters, Vol. 44, Issue 9, Apr. 24, 2008, pp. 598-598.

In conventional GaN-HEMTs, there is a problem that leakage current flows in the off state below the pinch-off voltage. The leakage current deteriorates the efficiency of a high power amplifier. Further, when the gate length is shortened, the leakage current increases, thus also interfering with the improvement of high frequency performance of the HEMT.

In order to investigate the cause of the leakage current, the inventors of the present invention performed simulations on a semiconductor device. As a result, the inventors found that the leakage current flows from the drain to the source by its passing through the lower portion of the GaN layer under the gate electrode. It is probable that since the gate voltage dominates the portion of the GaN directly under the gate electrode, no current flows in the portion; however, since the dominance of the gate voltage does not extend to the lower portion of the GaN layer, the leak current easily flows in the portion. For this reason, when simulations on a semiconductor device were carried out in the cases where the GaN layer was reduced in thickness, it turned out that the leak current thereof was reduced.

It was found that the reduction of thickness of the GaN layer is effective for improvement of the leak current as discussed above. However, merely reducing the film thickness of the GaN layer causes the reduction of the film thickness of the buffer layer for improving the crystal property, which causes a problem that the crystal property deteriorates. Therefore, conventionally, it is very difficult to reduce only the film thickness of the channel where electrons flow while keeping a state of the buffer layer having a large thickness.

SUMMARY OF THE INVENTION

The present invention has been made to solve the above-mentioned problems, and an object of the present invention is to obtain a semiconductor device where a leakage current unnecessary for the operation of the semiconductor device can be reduced and a manufacturing method of the semiconductor device.

The semiconductor device according to the present invention includes a channel layer where electrons move; a barrier layer provided on the channel layer and forming two dimensional electron gas in the channel layer; and a buffer layer provided under the channel layer and having an isolation layer for suppressing a leakage current at least between the channel layer and the buffer layer.

According to the present invention, the isolation layer for suppressing the leakage current is provided at least between the channel layer and the buffer layer formed under the channel layer. Thus, the channel layer where electrons move can be reduced in thickness and the buffer layer can be sufficiently thickened such that the channel layer and the barrier layer are of high-quality crystal. In this way, in a HEMT to which the present invention is applied, the drain leakage current flowing between the channel layer and the buffer layer can be suppressed, and the pinch-off characteristic thereof becomes excellent. Therefore, the application of the HEMT of the present invention can achieve the production of a highly-efficient amplifier and an amplifier capable of performing a high-frequency operation.

DETAILED DESCRIPTION OF THE PREFERRED EMBODIMENTS

First Embodiment

Figure 1:
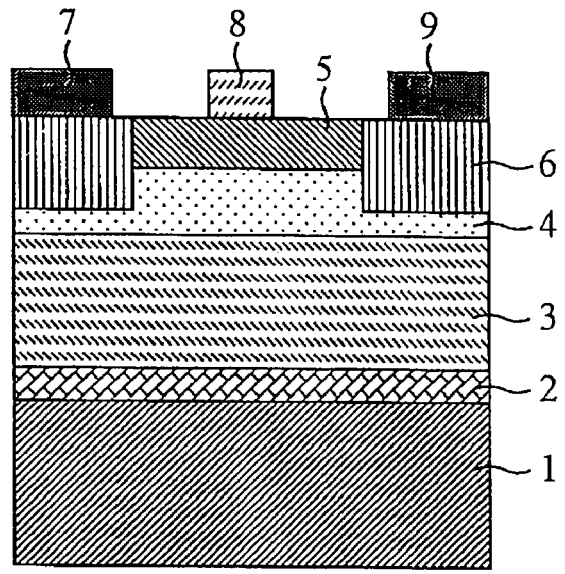
FIG. 1 is a view showing a construction of a semiconductor device in accordance with a first embodiment of the present invention.

FIG. 1 is a view showing a construction of a semiconductor device in accordance with the first embodiment of the present invention, and is a cross sectional structural view of a GaN-HEMT to which the present invention is applied. Referring to FIG. 1, the GaN-HEMT in accordance with the first embodiment is characterized in that a GaN buffer layer 3 is formed on a semi-insulating SiC substrate 1 through an AlN buffer layer 2 and heavy ions are ion-implanted into at least a portion of the GaN buffer layer 3. The GaN buffer layer 3 has formed thereon a GaN channel layer 4 for forming two-dimensional electron gas, and the GaN channel layer 4 has formed thereon a pair of n+ areas (n-type semiconductor areas) 6 with a space provided therebetween such that an AlGaN barrier layer 5 is interposed therebetween. One of the n+ areas 6 making the pair has a source electrode 7 formed thereon, the other thereof has a drain electrode 9 formed thereon, and the AlGaN barrier layer 5 interposed therebetween has a gate electrode 8 formed thereon.

Since the GaN buffer layer 3 has the heavy ions ion-implanted thereinto as described above, the layer is of high resistance and a low current flows therein (in a level that can be ignored in the operation of the GaN-HEMT). In order to fabricate such a high resistance layer thereover, defects are intentionally created in the GaN buffer layer 3 by ion implantation. For this reason, heavy atoms are implanted into the GaN buffer layer 3. In order to restrain the leakage current from flowing, it is essential only that the flow of the electric current can be prevented between the GaN channel layer 4 and the GaN buffer layer 3, and thus there only has to be a layer (isolation layer) into which ions are implanted in at least the upper portion of the GaN buffer layer 3. In this way, the operation of the GaN-HEMT is limited only in the GaN channel layer 4, thus performing an operation having a small amount of leakage current.

The semi-insulating SiC substrate 1 is very different from the GaN channel layer 4 in property. Further, the GaN channel layer 4 is formed of crystal having poor quality in its portion near to the semi-insulating SiC substrate 1; however, the crystal forming the channel layer increases in quality with increasing a distance from the SiC substrate and comes to have high quality and original property of GaN. Therefore, in order to keep the crystal layer forming the GaN channel layer 4 in high quality, the GaN buffer layer 3 is formed therebetween.

It should be understood that it is desirable that the GaN channel layer 4 have a thickness $d_2$ satisfying the following equation (1):

$$d_2 \leq \frac{L_{sd} - 2d_3}{\frac{V_d}{-(V_g - V_p)} - 2} - d_1 \quad (1)$$

where $L_{sd}$ is the distance between the source and the drain; $d_3$ is the depth of the n+ area 6; $V_d$ is the drain voltage; $V_g$ is the gate voltage; $V_p$ is the pinch-off voltage; and $d_1$ is the thickness of the AlGaN barrier layer 5, and where $L_{sd}$ is $L_g+L_{sg}+L_{gd}$ ($L_g$ is the gate length, $L_{sg}$ is the distance between the source and the gate, and $L_{gd}$ is the distance between the gate and the drain.).

Next, the derivation of the equation (1) is described as follows:

The leakage current is generated since the dominance of the gate voltage under the gate electrode 8 is weaker than that of the drain voltage. The larger is the potential, the more flows the current. Thus, the dominance of the gate voltage, $F_g$, is shown by the value ($E_g \cdot L_g$) which is the integral of the electric field ($E_g = -(V_g - V_p)/(d_1 + d_2)$) generated by the gate voltage under the gate electrode 8 over the gate length. Further, as for the dominance of the drain voltage, $F_d$, on the assumption that the drain voltage is uniformly applied over the distance ($L_1 = L_{sd} + 2(d_1 + d_2 - d_3)$) and thinking as in the gate voltage, it is assumed that $F_d = E_d \cdot L_g$, where $E_d$ is $V_d/L_1$. Here, if it is assumed that the leakage current is not generated when the dominance of the drain voltage, $F_d$ is smaller than that of the gate voltage, $F_g$, the above-mentioned equation (1) is obtained.

Figure 2:
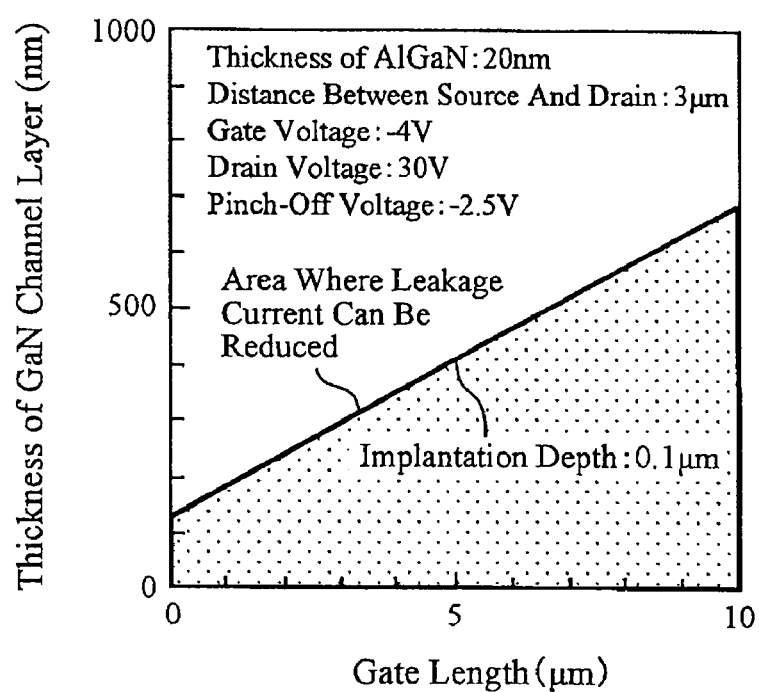
FIG. 2 is a graph showing the relation between the thickness of a GaN channel layer and the length of a gate electrode in the semiconductor device in FIG. 1.

FIG. 2 is a graph showing the relation between the thickness of the GaN channel layer 4 and the length of the gate electrode 8 in the semiconductor device shown in FIG. 1, and is also a diagram showing the relation between the thickness of the GaN channel layer 4 and the length of the gate electrode 8 (gate length), calculated from the above equation (1). As shown in FIG. 2, when the gate length is reduced, in order to suppress the leakage current, it is necessary to reduce the thickness of the GaN channel layer 4.

The gate voltage $V_g$ and the drain voltage $V_d$ are determined by the operating condition of the GaN-HEMT. For example, in a GaN-HEMT applied to a high power amplifier, $V_d$ having about one-third to once the operating voltage and $V_g$ having about twice to three times the pinch-off voltage are considered satisfactory.

As discussed above, in accordance with the first embodiment, a current does not easily flow in the GaN buffer layer 3, and further the GaN channel layer 4 can be reduced in thickness. Thus, a GaN-HEMT having a low leakage current can be fabricated. Therefore, the production of a high power amplifier suitable for highly efficient, high-frequency operations can be achieved.

Next, the manufacturing method of the GaN-HEMT shown in FIG. 1 is described as follows:

FIGS. 3A-3D are views showing the manufacturing procedure of the semiconductor device shown in FIG. 1, and the processing thereof proceeds from FIG. 3A to FIG. 3D to produce the GaN-HEMT shown in FIG. 1.

Figure 3A:
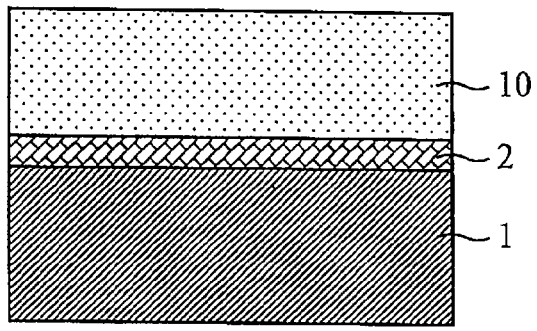
FIGS. 3A-3E are views showing the manufacturing process of the semiconductor device in FIG. 1.

First, in the step shown in FIG. 3A, the AlN buffer layer 2 and a GaN layer 10 are formed over the semi-insulating SiC substrate 1 by MOCVD (Metal Organic Chemical Vapor Deposition), MBE (Molecular Beam Epitaxy), or the equivalent deposition method. At that time, the GaN layer 10 is arranged to have a thickness such that an upper portion of the GaN layer 10 has an excellent crystal property. The thickness thereof varies according to deposition conditions; however, in general, the thickness thereof is about 500-2000 nm.

Figure 3B:
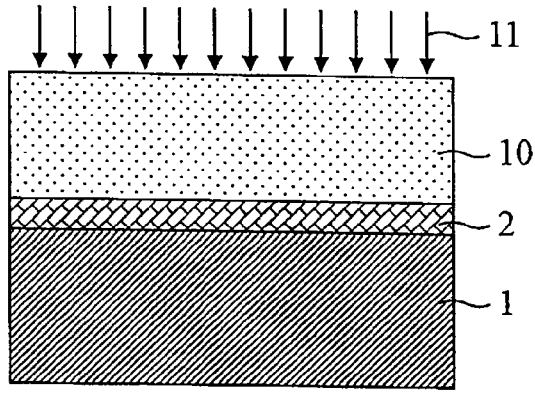

Then, in the step shown in FIG. 3B, heavy ions 11 are ion implanted into the GaN layer 10. Heavy ions capable of creating defects in the GaN layer include Ar ion, Kr ion, Zn ion, Mg ion, and Fe ion. Of these ions, the atom (Zn ion or Mg ion) serving as an acceptor easily captures an electron, which is more desirable.

The ions 11 may be implanted into the whole region of the GaN layer 10; however, particularly in order to cause the GaN layer 10 to have high resistance in its upper part, the ion concentration may be increased only in the upper part of the GaN layer 10 or the ion implantation may be performed only to the upper part thereof. The amount of defects only has to be more than the impurity concentration in the GaN layer 10, and ions are implanted with a dose of from $1E12/cm^2$ to $1E16/cm^2$. Since the depth to be implanted may be shallow, the acceleration energy may be 200 keV or less.

Figure 3C:
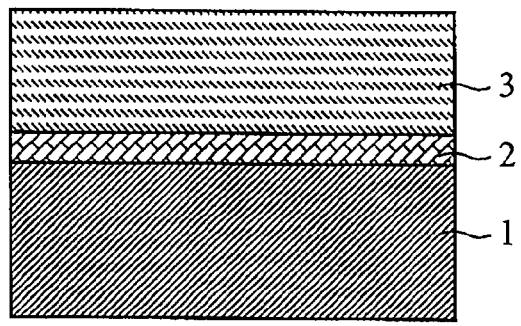

Hereupon, in the step shown in FIG. 3B, an ion implantation may be carried out in a state where the GaN layer 10 is covered with oxide film or nitride film. This allows a GaN buffer layer 3 ion implanted by heavy ions 11 to be formed as shown in FIG. 3C.

Figure 3D:
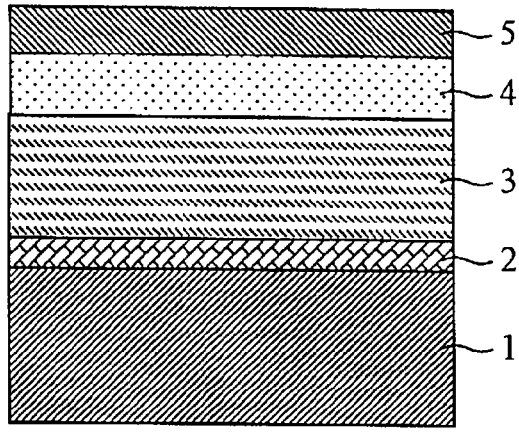

Subsequently, in the step shown in FIG. 3D, a GaN channel layer 4 and an AlGaN barrier layer 5 are crystal formed on the GaN buffer layer 3 by MOCVD or MBE. At that time, the GaN buffer layer 3 has been formed with an excellent crystal property in its upper part, and thus the GaN channel layer 4 and the AlGaN barrier layer 5 can be also formed thereon with an excellent crystal property.

The steps from FIG. 3A to FIG. 3D are executed throughout in a vacuum without exposing the workpiece to the atmosphere, thus forming excellent crystal layers. Then, n+ areas 6, a source electrode 7, a gate electrode 8, and a drain electrode 9 are formed thereon with a Si ion implantation (doping) and a lift-off method (for forming electrode metal). Note that it is desirable that each of the n+ areas 6 be not in contact with the GaN buffer layer 3.

Figure 3E:
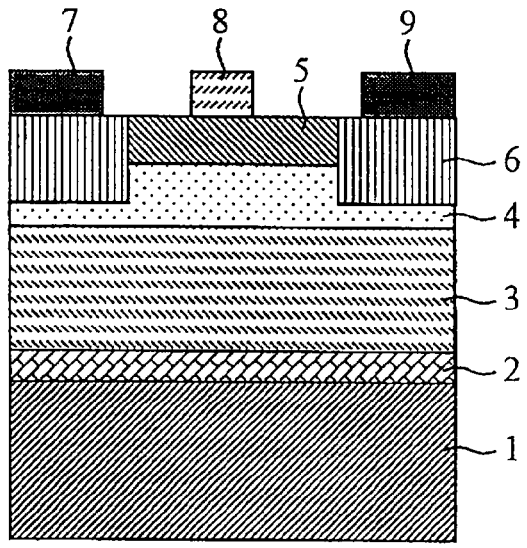

The above-described procedures can provide a structure as shown in FIG. 3E. It should be appreciated that the structure shown by way of example in FIG. 3E shows only the minimum constituent elements required to the operation of the GaN-HEMT. As required, a gate electrode of T type or Y type, a field isolation, a protection film, wirings, plating, a via hole, an electric field relaxation structure for a field plate, and so on may be optionally fabricated.

As described above, the first embodiment permits the drain leakage current flowing between the GaN channel layer 4 and the GaN buffer layer 3 to be suppressed and thereby a GaN-HEMT having an excellent pinch-off characteristic to be obtained. This is because the GaN buffer layer 3 is arranged to have a high resistance obtained by creating defects in at least the upper part of the GaN buffer layer, which is in contact with the GaN channel layer 4, and the GaN channel layer 4 is formed so as to have a thin thickness according to the above equation (1), thus enabling the channel layer 4 where electrons move to be reduced in thickness and further the GaN buffer layer 3 to be sufficiently thickened so as to render a crystal having a high quality. Therefore, the application of such a Ga-HEMT can realize the production of a highly-efficient amplifier and an amplifier capable of performing a high-frequency operation.

Figure 4:
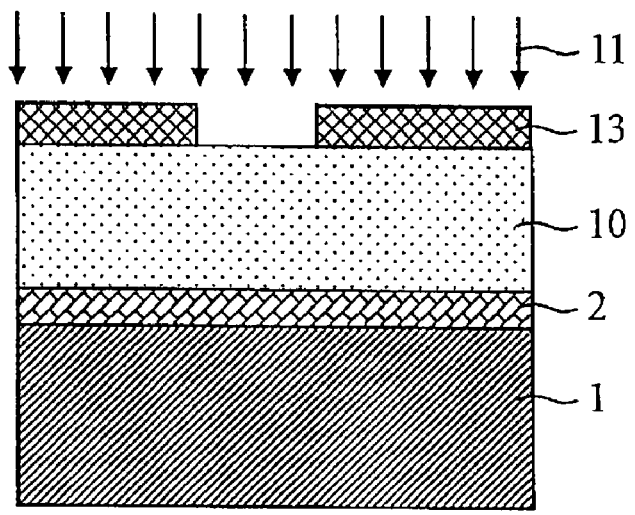
FIG. 4 is a cross sectional structural view showing another example of the step of forming a GaN buffer layer.

It should be understood that when the GaN buffer layer 3 is formed (see FIG. 3B), the first embodiment shows the case where the ions 11 are implanted uniformly in the lateral direction of the GaN layer 10 is shown; however, as shown in FIG. 4, the ions 11 are ion-implanted into the GaN layer 10 through a resist 13 masking the area other than the area to be located under the gate electrode 8, thus implanting more ions into the area to be under the gate, and thereby the channel layer may be arranged to have a reduced thickness only in the area.

Figure 5:
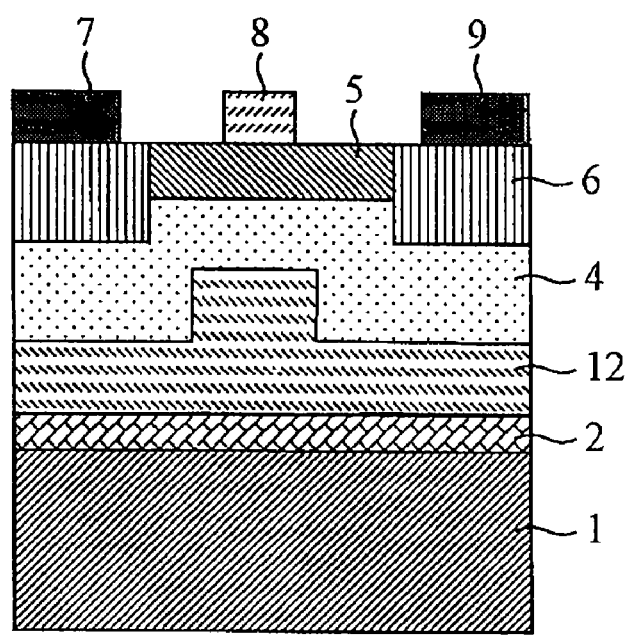
FIG. 5 is a view showing another construction of a semiconductor device in accordance with the first embodiment.

The leakage current flows through a deep portion of the GaN layer 10 under the gate. Thus, when the ion implantation is performed only to the portion thereof under the gate, the effect similar to the above-described one can be obtained. This can be achieved by forming the resist 13 having an opening portion only in the area of the gate as shown in FIG. 4 and carrying out an ion implantation through the resist. A GaN-HEMT shown in FIG. 5 can be produced by performing the processes as with the first embodiment except for the step shown in FIG. 4. A GaN buffer layer 12 formed in a convex shape can be obtained by executing the step shown in FIG. 4, and thereby only the area under the gate can be arranged to have a high resistance.

Second Embodiment

In the first embodiment, the case is shown, where an isolation layer having a high resistance is formed in at least a portion of the GaN buffer layer by the ion implantation. In the second embodiment, however, a construction is discussed in which a leakage current flowing between the GaN channel layer and the GaN buffer layer is suppressed by interposing a superlattice isolation layer electrically separating the GaN buffer layer and the GaN channel layer therebetween.

Figure 6:
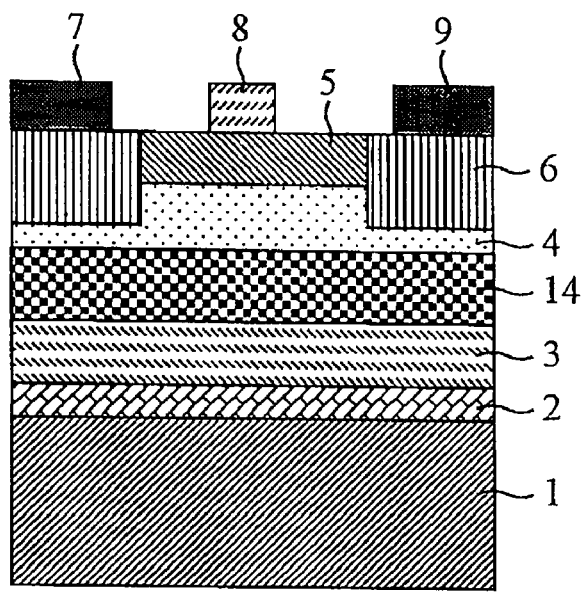
FIG. 6 is a view showing a construction of a semiconductor device in accordance with a second embodiment of the present invention.

FIG. 6 is a view showing a construction of a semiconductor device in accordance with the second embodiment of the present invention, and is a cross sectional structural view of a GaN-HEMT to which the present invention is applied. Referring to FIG. 6, a superlattice isolation layer 14 has the function of electrically separating the GaN channel layer 4 and the GaN buffer layer 3, and thus the interface between the GaN channel layer 4 and the superlattice isolation layer 14 requires a barrier of about 0.03 eV or more, the thermal energy at room temperature. Moreover, in order to prevent an unnecessary conducting path from being formed by interposing the superlattice isolation layer 14 therebetween, it is necessary to avoid the formation of two dimensional electron gas at a place other than the channel.

The superlattice isolation layer 14 is designed so as to meet the above-described two requirements. A GaN-HEMT is, unlike a GaAs-HEMT, characterized in that its polarization (spontaneous polarization and piezo polarization) is strong, and the consideration of polarization is absolutely necessary for the design of the superlattice isolation layer 14. Since at the interface with strong polarization, two dimensional electron gas is formed, a structure is employed in the second embodiment, in which the bandgap is gradually expanded from the same material as that of the upper face of the GaN buffer layer 3. In this context, the barrier is provided by forming a superlattice. A superlattice becomes of high resistance by trapping electrons in the well thereof. The bandgap difference between the well and the barrier layer is designed so as to be at least 0.03 eV or more.

Figure 7:
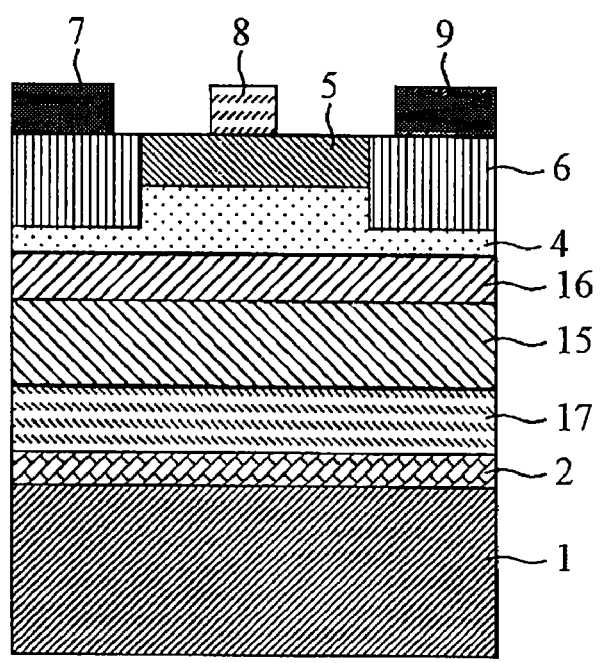
FIG. 7 is a cross sectional structural view showing a GaN-HEMT in accordance with the second embodiment by way of example.

FIG. 7 is a cross sectional structural view showing a GaN-HEMT in accordance with the second embodiment by way of example. In the example shown in FIG. 7, the superlattice isolation layer 14 is composed of a layer 15, which is formed over a GaN buffer layer 17 and in which the Al content changes in AlGaN (the Al content or component increases in AlGa upwardly from the GaN buffer layer), and an AlGaN/GaN superlattice layer 16.

Figure 8:
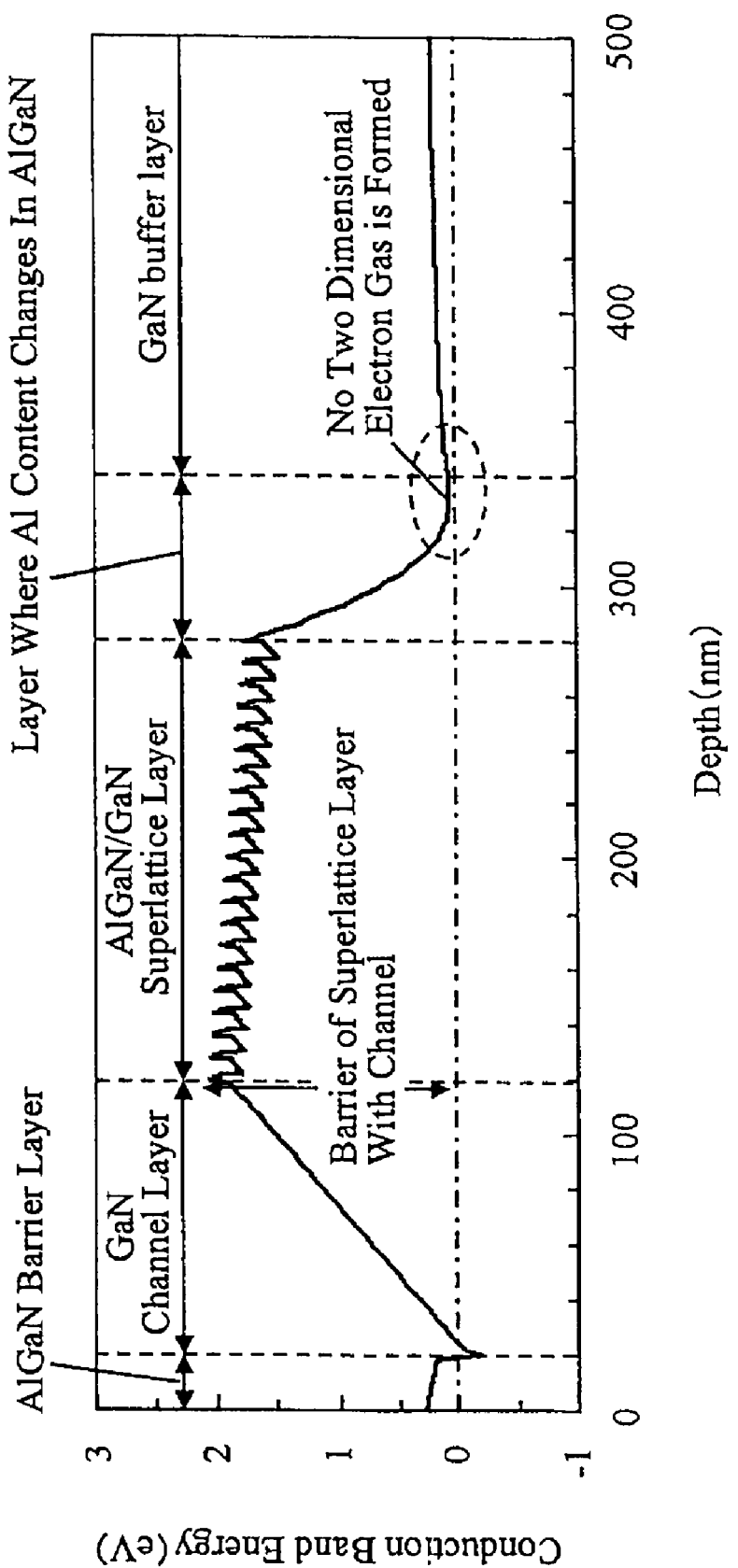
FIG. 8 is an energy band diagram of the GaN-HEMT in FIG. 7.

FIG. 8 is an energy band diagram of the GaN-HEMT shown in FIG. 7, and shows the energy band in the direction of depth of the sectional view of FIG. 7. The GaN-HEMT has a detailed structure where the GaN buffer layer 17 is 500 nm in thickness (however, illustrated to 160 nm in FIG. 8); the layer 15 where the Al content changes in the AlGaN is 60 nm in thickness (the Al content changes from 0 to 0.08); the AlGaN/GaN superlattice layer 16 is 160 nm in thickness (the well is 6 nm in thickness of GaN, and the barrier is 2 nm in thickness of AlGaN (the Al content is 0.08)); the GaN channel layer 4 is 100 nm in thickness; and the AlGaN barrier layer 5 is 20 nm in thickness (the Al content is 0.2).

As shown in FIG. 8, a GaN-HEMT is obtained in which two dimensional electron gas is not formed except within the channel and the barrier of superlattice layer with the channel is sufficiently high. Moreover, the well is formed by the AlGaN/GaN superlattice layer 16. Even if an electron with high energy gets over the barrier, the electron is trapped by the well and cannot contribute to conduction. Thus, the AlGaN/GaN superlattice layer 16 is considered to act as a pseudo trap.

Figure 9:
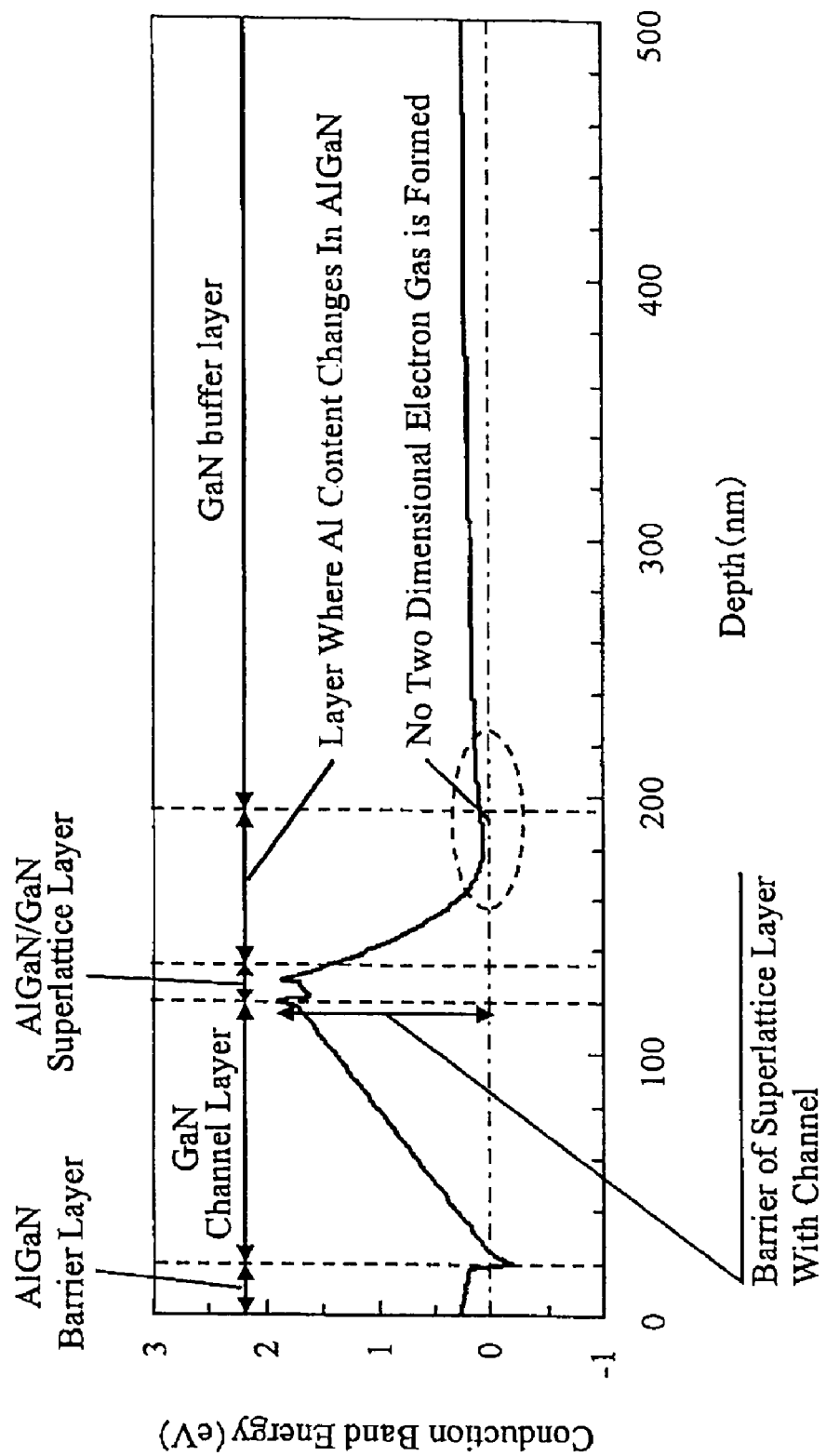
FIG. 9 is an energy band diagram in the other construction of the GaN-HEMT in accordance with the second embodiment.
Figure 10:
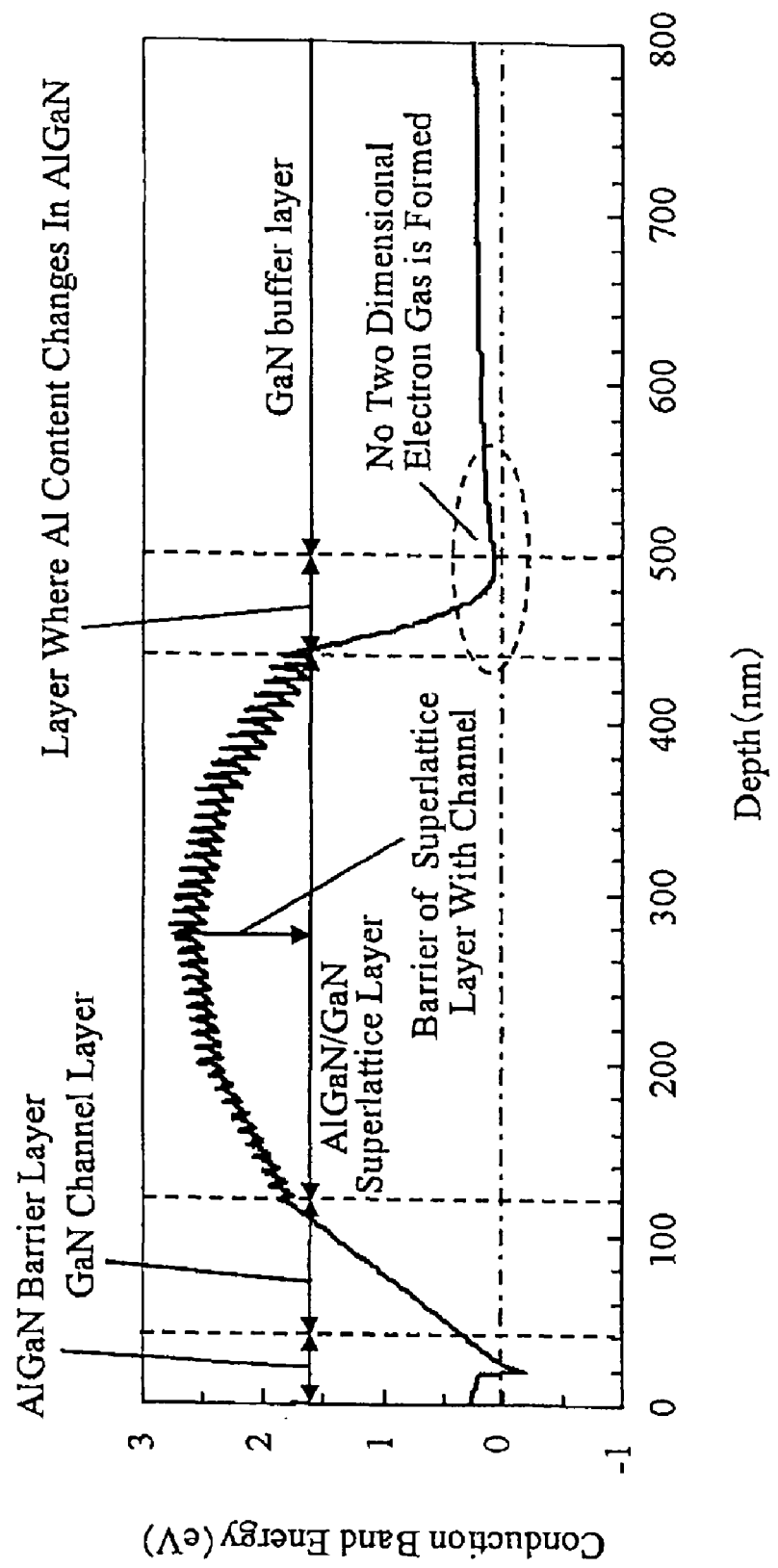
FIG. 10 is an energy band diagram in the other construction of the GaN-HEMT in accordance with the second embodiment.
Figure 11:
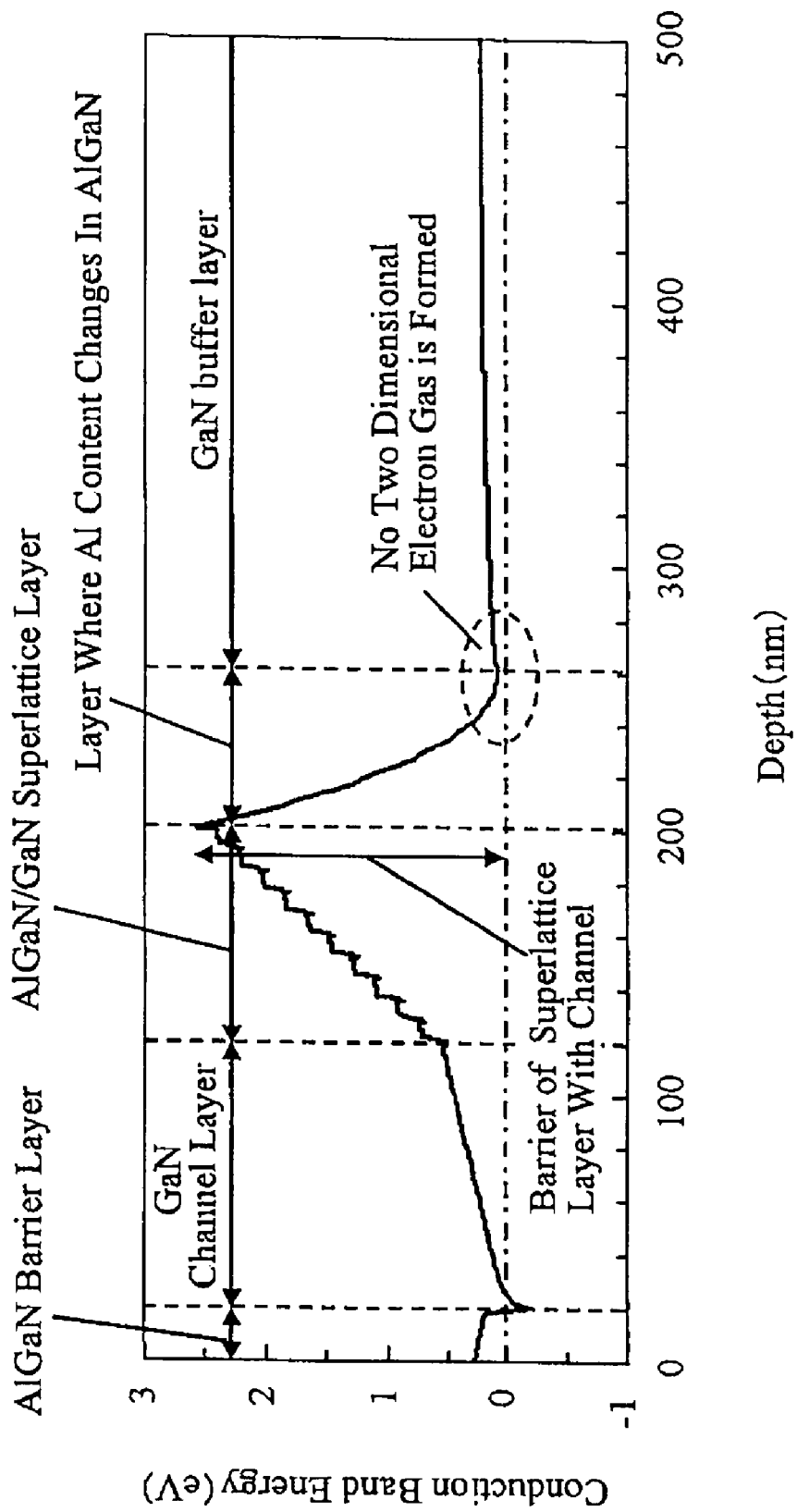
FIG. 11 is an energy band diagram in the other construction of the GaN-HEMT in accordance with the second embodiment.

In FIG. 9 to FIG. 11, the band diagrams of examples of other structures are illustrated. Also in the structures of which the band diagrams are shown in FIG. 9 to FIG. 11, it is found that there is no formation of two dimensional electron gas except within the well trapping electrons and the channel.

An example shown in FIG. 9 illustrates the case of a single superlattice well. The GaN-HEMT has a structure where the GaN buffer layer 17 is 500 nm in thickness; the layer 15 where the Al content changes in the AlGaN is 60 nm in thickness (the Al content changes from 0 to 0.08); the AlGaN/GaN superlattice layer 16 is 8 nm in thickness (the well is 6 nm in thickness of GaN, and the barrier is 2 nm in thickness of AlGaN (the Al content is 0.08)); the GaN channel layer 4 is 100 nm in thickness; and the AlGaN barrier layer 5 is 20 nm in thickness (the Al content is 0.2).

An example shown in FIG. 10 illustrates the case where two or more superlattices each having a barrier different from each other are combined. The GaN-HEMT has a structure where the GaN buffer layer 17 is 500 nm in thickness; the layer 15 where the Al content changes in the AlGaN is 60 nm in thickness (the Al content changes from 0 to 0.08); the AlGaN/GaN superlattice layer 16 is composed of first to fourth layers deposited thereover, the AlGaN/GaN superlattice layer 16 (the first layer) is 60 nm in thickness (the well is 6 nm in thickness of GaN, and the barrier is 2 nm in thickness of AlGaN (the Al content is 0.1)); the AlGaN/GaN superlattice layer 16 (the second layer) is 60 nm in thickness (the well is 6 nm in thickness of GaN, and the barrier is 2 nm in thickness of AlGaN (the Al content is 0.08)); the AlGaN/GaN superlattice layer 16 (the third layer) is 60 nm in thickness (the well is 6 nm in thickness of GaN, and the barrier is 2 nm in thickness of AlGaN (the Al content is 0.06)); the AlGaN/GaN superlattice layer 16 (the fourth layer) is 60 nm in thickness (the well is 6 nm in thickness of GaN, and the barrier is 2 nm in thickness of AlGaN (the Al content is 0.04)); the GaN channel layer 4 is 100 nm in thickness, and the AlGaN barrier layer 5 is 20 nm in thickness (the Al content is 0.2).

An example shown in FIG. 11 illustrates the case where the superlattice well is composed of InGaN and the barrier is composed of GaN. In such a way, also in the superlattice other than the superlattice composed of GaN and AlGaN, the effect similar to that of the above-discussed HEMT is obtained. The GaN-HEMT has a structure where the GaN buffer layer 17 is 500 nm in thickness; the layer 15 where the Al content changes in the AlGaN is 60 nm in thickness (the Al content changes from 0 to 0.08); the GaN/InGaN superlattice layer 16 is 160 nm in thickness (the well is 2 nm in thickness of InGaN (the In content is 0.08), and the barrier is 2 nm in thickness of GaN); the GaN channel layer 4 is 100 nm in thickness; and the AlGaN barrier layer 5 is 20 nm in thickness (the Al content is 0.2).

In the above description, the cases where the isolation layer and the buffer layer are of n-type are discussed; however, part of those layers may be of p-type. When those layers are of p-type, the barrier can be increased in height, and thus those layers perform the same function as that of the above-described layer 15 where the Al content changes in the AlGaN. For this reason, the structures are contemplated, in which a p-type layer is put in the layer 15 where the Al content changes in the AlGaN as shown in FIG. 12, or a portion of the GaN buffer layer 17 is made of p type as shown in FIG. 13.

Figure 12:
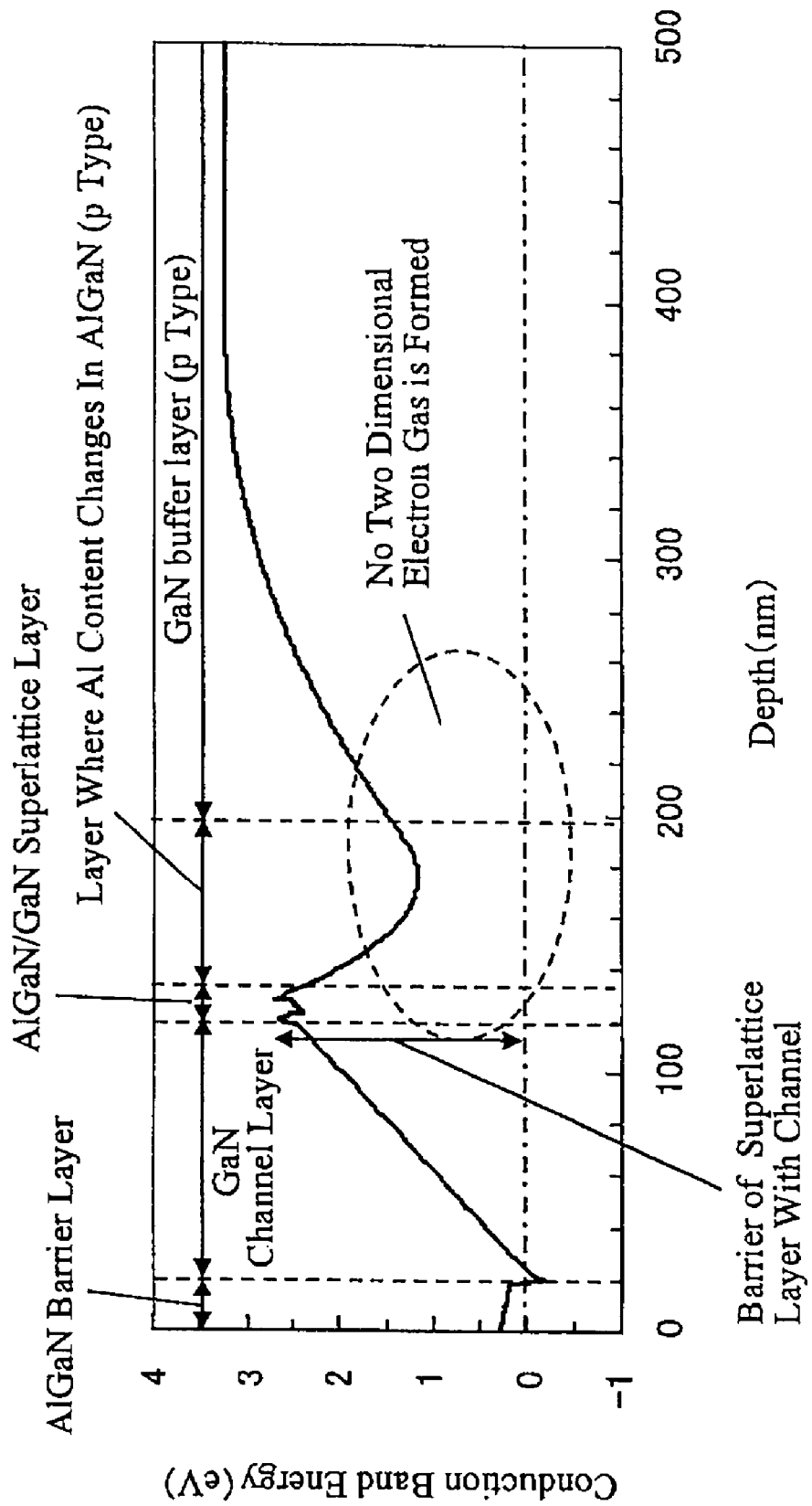
FIG. 12 is an energy band diagram in the other construction of the GaN-HEMT in accordance with the second embodiment.

In this context, the structure shown in FIG. 12 is as follows: the GaN buffer layer (p type) is 500 nm in thickness; the layer (p type) where the Al content changes in the AlGaN is 60 nm in thickness (the Al content changes from 0 to 0.08); the AlGaN/GaN superlattice layer 16 is 8 nm in thickness (the well is 6 nm in thickness of GaN, and the barrier is 2 nm in thickness of AlGaN (the Al content is 0.08)); the GaN channel layer 4 is 100 nm in thickness; and the AlGaN barrier layer 5 is 20 nm in thickness (the Al content is 0.2).

Figure 13:
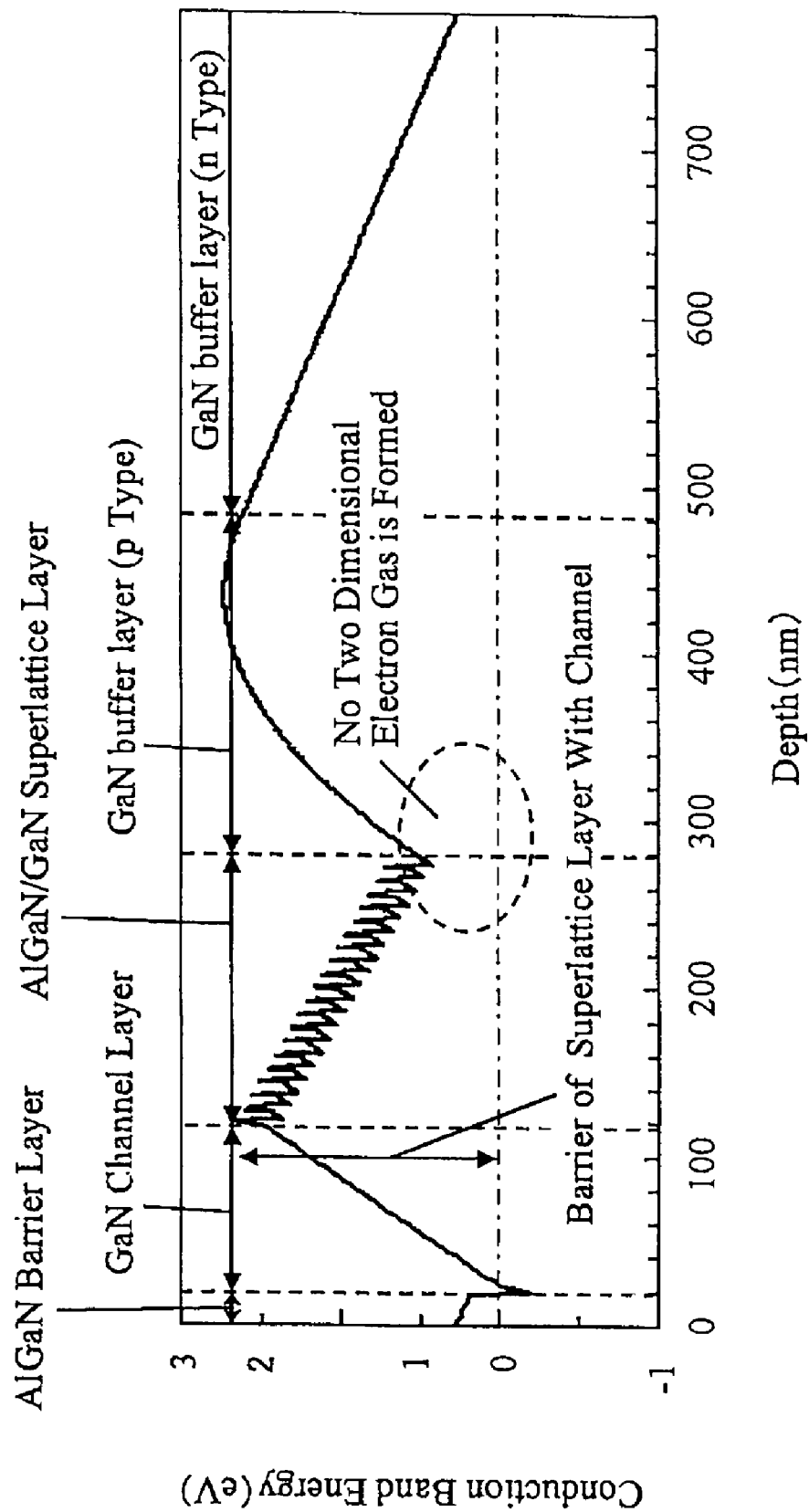
FIG. 13 is an energy band diagram in the other construction of the GaN-HEMT in accordance with the second embodiment.

Further, the structure shown in FIG. 13 is as follows: the GaN buffer layer (n type) is 300 nm in thickness; the GaN buffer layer (p type) is 200 nm in thickness; the layer 15 where the Al content changes in the AlGaN is 60 nm in thickness (the Al content changes from 0 to 0.08); the AlGaN/GaN superlattice layer 15 is 160 nm in thickness (the well is 6 nm in thickness of GaN, and the barrier is 2 nm in thickness of AlGaN (the Al content is 0.08)); the GaN channel layer 4 is 100 nm in thickness; and the AlGaN barrier layer 5 is 20 nm in thickness (the Al content is 0.2).

Figure 14:
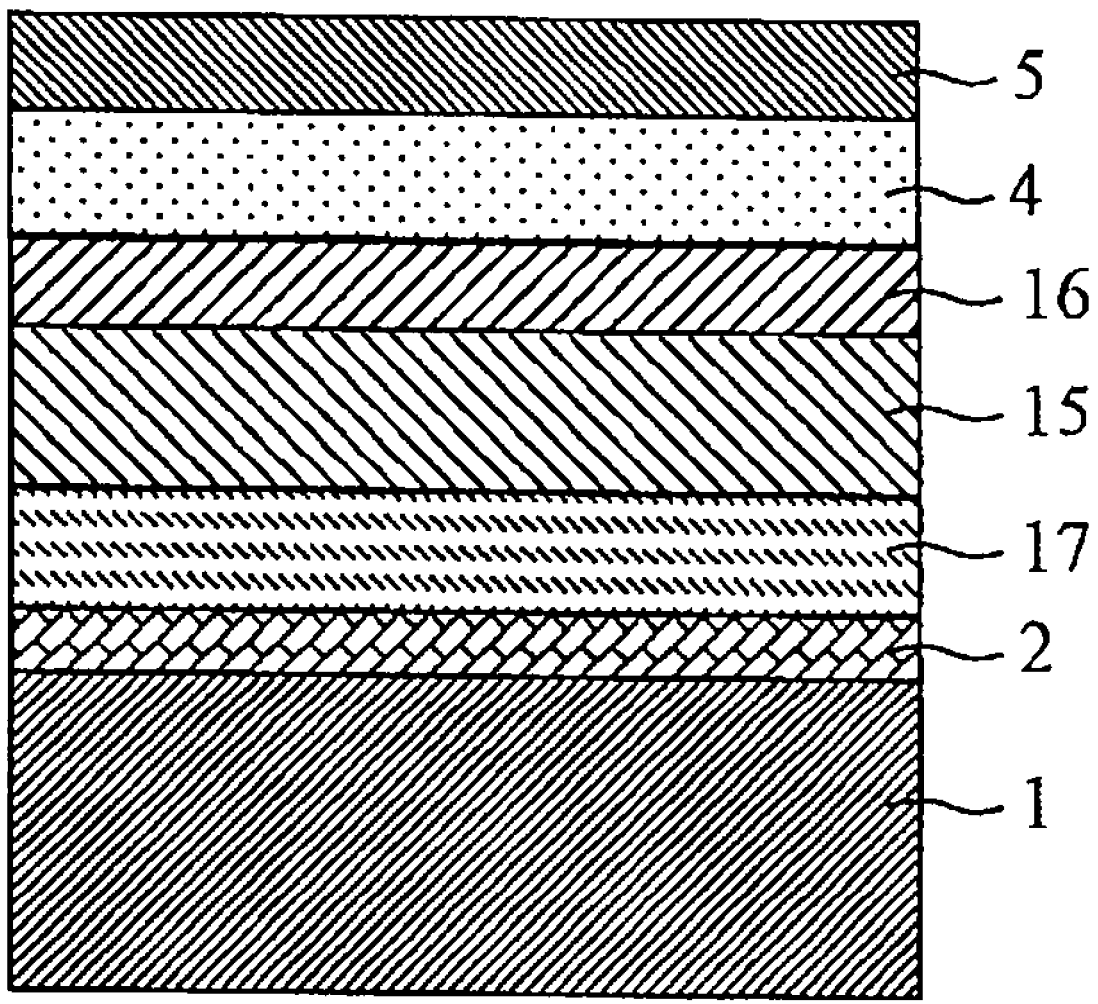
FIG. 14 is a view showing a state where crystal layers have been formed in the manufacturing process of the semiconductor device in FIG. 7.

Next, the manufacturing method of the GaN-HEMT in accordance with the second embodiment as shown in FIG. 7 is described as follows:

In order to produce the GaN-HEMT in accordance with the second embodiment, first, the GaN buffer layer 17 is deposited over the semi-insulating SiC substrate 1 through the AlN buffer layer 2 as shown in FIG. 14. After that, the GaN buffer layer 17 has deposited in a crystal state thereover the layer 15 where the Al content changes in the AlGaN and the AlGaN/GaN superlattice layer 16, and further the GaN buffer layer has deposited thereover the GaN channel layer 4 and the AlGaN barrier layer 5.

Thus, in accordance with the second embodiment, it is not required to perform ion implantation in the course of crystal growth unlike the first embodiment, and the crystal growth can be done by continuous operation. After obtaining the structure shown in FIG. 14, the process using a conventional manufacturing method of a GaN-HEMT is carried out as with the first embodiment, thus enabling a GaN-HEMT of which the structure is shown in FIG. 7 to be produced. It should be appreciated that desirably, the undersides of the n+ areas 6 are not in contact with the layers 15, 16 serving as the isolation layer and the buffer layer 17 (specifically, those n+ areas are present within the GaN channel layer 4). This is because if the n+ area 6 is present within the layers 15, 16 functioning as the isolation layer or the GaN buffer layer 17, there is possibility that a conduction path from the n+ area to the isolation layer or/and from the buffer layer to the n+ area is formed therein.

As mentioned above, in accordance with the second embodiment, the superlattice isolation layer 14 (the layers 15, 16) for electrically separating the GaN buffer layer 17 and the GaN channel layer 4 is interposed therebetween. Thus, the drain leakage current flowing between the GaN channel layer 4 and the GaN buffer layer 3 can be suppressed and a GaN-HEMT having an excellent pinch-off characteristic can be provided. Therefore, the application of the Ga-HEMT can achieve the production of a highly efficient amplifier and an amplifier capable of performing a high-frequency operation.

It should be understood that in the first and the second embodiments, the cases where the channel layer 4 and barrier layer are composed of GaN and AlGaN, respectively, are discussed by way of examples; however, the present invention can be applied as long as those layers is composed of nitride semiconductor, even if those layers is composed of other materials. For example, it may be arranged that the channel layer be formed of InGaN or AlInGaN, and the barrier layer be formed of AlInN or AlInGaN of which the bandgap is wider than that of the channel. Furthermore, those layers each may be provided with a multilayer structure, and do not have to be a single layer. The same goes for materials of the buffer layer. The buffer layer does not have to be formed of GaN, but the layer may have a single layer or multilayer structure formed of AlGaN or the like.

What is claimed is:

1. A semiconductor device comprising:
   a channel layer where electrons move;
   a barrier layer provided on the channel layer and forming two dimensional electron gas in the channel layer;
   a buffer layer provided under the channel layer; and
   an isolation layer that is separate from at least a lower portion of the buffer layer and provided between the lower portion of the buffer layer and the channel layer, the isolation layer being configured to suppress a leakage current at least between the channel layer and the buffer layer,
   wherein the channel layer is a GaN channel layer including GaN,
   wherein the barrier layer is an AlGaN barrier layer including AlGaN,
   wherein the buffer layer is a GaN buffer layer including GaN, and
   wherein the isolation layer includes:
      a layer that includes AlGaN where the Al content in AlGaN upwardly increases from the GaN buffer layer and where a bandgap upwardly gradually expands from the interface on the side of the buffer layer, and
      a layer having a superlattice structure that is variant in bandgap and including AlGaN and GaN.

2. The semiconductor device according to claim 1, wherein the buffer layer includes a p-type layer.

3. A semiconductor device comprising:
   a channel layer where electrons move;
   a barrier layer provided on the channel layer and forming two dimensional electron gas in the channel layer;
   a buffer layer provided under the channel layer; and
   an isolation layer provided between the buffer layer and the channel layer and configured to suppress a leakage current at least between the channel layer and the buffer layer,
   wherein the isolation layer includes:
      a layer having a structure where a bandgap upwardly gradually expands from the interface on the side of the buffer layer; and
      a layer having a superlattice structure that is variant in bandgap.

* * * * *